(12) United States Patent
Austin et al.

(10) Patent No.: US 11,451,234 B1
(45) Date of Patent: Sep. 20, 2022

(54) DELAY LOOKED LOOP CIRCUIT AND METHOD OF MEASURING DELAY

(71) Applicant: NANYA TECHNOLOGY CORPORATION, New Taipei (TW)

(72) Inventors: John Austin, New Taipei (TW); Joseph Iadanza, New Taipei (TW); Fran Keyser, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/534,384

(22) Filed: Nov. 23, 2021

(51) Int. Cl.
*H03L 7/081* (2006.01)
*G11C 7/22* (2006.01)
*H03L 7/085* (2006.01)

(52) U.S. Cl.
CPC ............ *H03L 7/0812* (2013.01); *G11C 7/222* (2013.01); *H03L 7/085* (2013.01)

(58) Field of Classification Search
CPC .............................. H03L 7/0812; H03L 7/085
See application file for complete search history.

(56) References Cited

U.S. PATENT DOCUMENTS

| | | | | |
|---|---|---|---|---|
| 9,369,265 | B1* | 6/2016 | Hong | H04L 7/0337 |
| 9,935,640 | B1* | 4/2018 | Chan | H03C 3/0991 |
| 10,014,901 | B1* | 7/2018 | Wang | H03L 7/18 |
| 10,056,909 | B1* | 8/2018 | Qi | H03L 7/0818 |
| 10,236,895 | B1* | 3/2019 | Rogers | H03L 7/081 |
| 10,374,617 | B2* | 8/2019 | Kuan | H03L 7/24 |
| 10,693,472 | B2* | 6/2020 | Kim | H03L 7/0998 |
| 10,862,427 | B1* | 12/2020 | Chan | H03C 3/0966 |
| 11,201,626 | B1* | 12/2021 | Jung | H03L 7/0891 |
| 2012/0062293 | A1* | 3/2012 | Liang | H03L 7/23 327/156 |
| 2012/0139595 | A1* | 6/2012 | Kamath | H03L 7/0812 327/158 |
| 2012/0207195 | A1* | 8/2012 | Kawasaki | H04B 1/04 375/219 |
| 2013/0169329 | A1* | 7/2013 | Searles | H03L 7/0816 327/158 |
| 2019/0058480 | A1* | 2/2019 | Kuan | H03L 7/089 |
| 2019/0348988 | A1* | 11/2019 | Kim | H03L 7/0805 |
| 2020/0195258 | A1* | 6/2020 | Avivi | H03L 7/093 |
| 2021/0159905 | A1* | 5/2021 | Tsuji | H03L 7/0818 |

FOREIGN PATENT DOCUMENTS

WO    WO-2013140755 A1 *  9/2013 ............... G06F 1/08

* cited by examiner

*Primary Examiner* — Adam D Houston
(74) *Attorney, Agent, or Firm* — JCIPRNET (57) ABSTRACT

A delay locked loop (DLL) circuit that includes a delay line, a pattern injecting circuit, a pattern detecting circuit and a counter is introduced. The delay line may align a phase of a reference clock signal with a phase of a feedback clock signal. The pattern injecting circuit injects a predetermined pattern to the reference clock signal to generate an injected reference clock signal and asserts the injected reference clock signal to the delay line. The pattern detecting circuit detects the predetermined pattern in the feedback clock signal. The counter determines a delay of the delay locked loop circuit according to a first timing when the injected reference clock signal is asserted to the delay line and a second timing when the predetermined pattern is detected in the feedback clock signal. A method of measuring a delay of the DLL circuit is also introduced.

20 Claims, 9 Drawing Sheets

DELAY LOCKED LOOP CIRCUIT AND METHOD OF MEASURING DELAY

BACKGROUND

Technical field

The disclosure relates to a delay locked loop circuit, and more particularly to a delay locked loop circuit and method of measuring delay that are capable of accurately measuring the delay of the delay locked loop circuit.

Description of Related Art

A delay locked loop (DLL) circuit is a circuit that is used to provide phase alignment between an input reference clock and a clock that is sourced from the DLL output and fed back to the DLL feedback clock input, typically through a feedback path external to the DLL. The DLL output that drives the feedback path is a controlled buffered version of the input reference clock, and the DLL circuit operates by adjusting the delay of the buffers internal to the DLL (the DLL delay line) until phase alignment at the DLL inputs is achieved.

In electronic devices including DLL circuit such as a memory, a key parameter that must be measured is the delay around the DLL circuit. This delay is typically designed to match delays of elements in signal paths from memory chip edge to memory arrays. Using the DLL circuit, these delays can essentially be removed, and phase alignment can be provided between desired points in the system. It is important to determine a delay of the DLL accurately so as to regulate operations of the memory.

SUMMARY

The disclosure introduces a delay locked loop (DLL) circuit and a method that may accurately measure the delay around the DLL circuit.

In some embodiments, the DLL circuit includes a delay line, a pattern injecting circuit, a pattern detecting circuit and a counter. The delay line is configured to align a phase of a reference clock signal with a phase of a feedback clock signal. The pattern injecting circuit is coupled to the delay line, and is configured to inject a predetermined pattern to the reference clock signal to generate an injected reference clock signal. The pattern injecting circuit may assert the injected reference clock signal to the delay line. The pattern detecting circuit is coupled to the delay line, and is configured to detect the predetermined pattern in the feedback clock signal. The counter is coupled to the pattern detecting circuit, and is configured to determine a delay of the delay locked loop circuit according to a first timing when the injected reference clock signal is asserted to the delay line and a second timing when the predetermined pattern is detected in the feedback clock signal.

In some embodiments, the method of measuring a delay of a DLL circuit includes steps of asserting a reference clock signal to a delay line of the delay locked loop circuit, wherein the delay line is configured to align a phase of the reference clock signal with a phase of a feedback clock signal; injecting a predetermined pattern to the reference clock signal to generate an injected reference clock signal; asserting the injected reference clock signal to the delay line; detecting the predetermined pattern in the feedback clock signal; and determining the delay of the delay locked loop circuit according to a first timing when the injected reference clock signal is asserted to the delay line and a second timing when the predetermined pattern is detected in the feedback clock signal.

According to embodiments of the disclosure, the measurement of the DLL delay may be performed after the delay line is calibrated and the DLL circuit is in a locked state. As such, the measured DLL reflects the delay seen during normal operation of the DLL circuit, and the measurement of the DLL delay with high accuracy is achieved. In addition, as the measurement of the DLL delay is performed based on the injection of the predetermined pattern to the reference clock signal and the detection of the predetermined pattern in the feedback clock signal, the measurement may be performed anytime without upsetting system environment.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
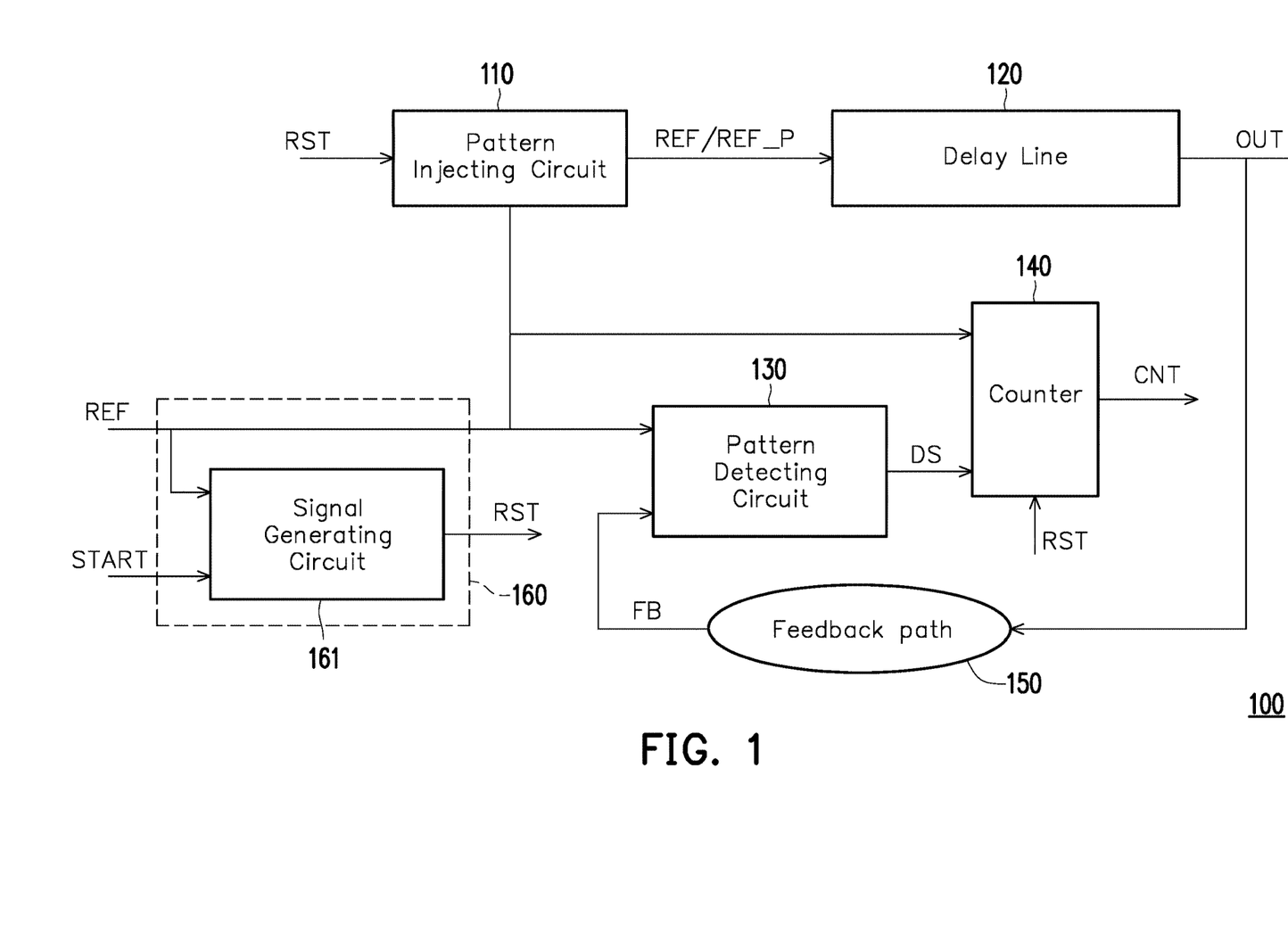
FIG. 1 illustrates a schematic diagram of a delay locked loop (DLL) circuit in accordance with some embodiments.

FIG. 1 illustrates a schematic of a DLL circuit 100 in accordance with some embodiments of the disclosure. The DLL circuit 100 may include a pattern injecting circuit 110, a delay line 120, a pattern detecting circuit 130, a counter 140 and a feedback path 150. The pattern injecting circuit 110 receives a reference clock signal REF and a reset signal RST and is configured to inject a predetermined pattern (also known as a bubble) to the reference clock signal REF upon the assertion of the reset signal RST to generate an injected reference clocks signal REF_P. In other words, the reset signal RST is used to trigger the pattern injecting circuit 110 to inject the predetermined pattern to the reference clock signal REF. In some embodiments, the pattern injecting circuit 110 may inject the predetermined pattern to the reference clock signal REF by adjusting at least one clock pulse of the reference clock signal REF. In an example, the predetermined pattern may include an addition of at least one clock pulse in the reference clock signal REF, in which the addition of the at least one clock pulse refers to holding the reference clock signal REF at a first logic state (i.e., high logic state) for at least one clock cycle of the reference clock signal REF. In another example, the predetermined pattern may include an absence of at least one clock pulse in the reference clock signal REF, in which the absence of the at least one clock pulse refers to holding the reference clock signal REF at a second logic state (i.e., low logic state) for at least one clock cycle of the reference clock signal REF. When the predetermined pattern includes the absence of a plurality of clock pulses in a plurality of clock cycles of the reference clock signal REF, the clock cycles could be consecutive clock cycles or non-consecutive clock cycles in the reference clock signal REF. These more complex patterns could be used for a variety of purposes, such as to eliminate the impacts of noise, distorted signals, or other disruptive influences. It is appreciated that the disclosure does not intend to limits the definition of the predetermined pattern. Any pattern that is injectable to the reference clock signal and is detectable from the feedback clock signal falls within the scope of the disclosure.

In some embodiments, when the reset signal RST is asserted to the pattern injecting circuit 110 (i.e., when the reset signal RST is in a first logic state), the pattern injecting circuit 110 injects the predetermined pattern to the reference clock signal REF to generate the injected reference clock signal REF_P and outputs the injected reference clock signal REF_P to the delay line 120. When the reset signal RST is not asserted to the pattern injecting circuit 110 (i.e., when the reset signal RST is in a second logic state), the pattern injecting circuit 110 does not inject the predetermined pattern to the reference clock signal REF and outputs the reference clock signal REF to the delay line 120.

The delay line 120 is coupled to the pattern injecting circuit 110 to receive an input signal (i.e., the reference clock signal REF or the injected reference clock signal REF_P) from the pattern injecting circuit 110. The delay line 120 may include at least one delay element circuitry (not shown) that is configured to delay an input signal that propagates through the delay line 120 to generate an output signal OUT. The delay element circuitry of the delay line 120 may be controlled to align the phases of the input signal and a feedback clock signal FB which is delivered from the output signal OUT in some embodiments. The feedback path 150 is coupled to the delay line 120, and is configured to generate the feedback clock signal FB based on the output signal OUT of the delay line 120. It is noted that the disclosure does not intend to limit the circuit structure of the feedback path 150, thus any circuit that has a function of feeding back a signal falls within the scope of the feedback path 150. In some embodiments, the DLL circuit 100 may include circuits (not shown) for comparing the phase of the feedback clock signal FB and the phase of the input signal to generate a phase error signal and for controlling the delay line 120 according to the phase error signal to align the phase of the input signal with the phase of the feedback clock signal FB. When the phase of the input signal is aligned with the phase of the feedback clock signal FB, the DLL circuit 100 is in a locked state. It is appreciated that components of the DLL circuit 100 may vary according to designed needs; and the DLL circuit 100 may include more or less circuits that are illustrated in FIG. 1.

In an example, when the reference clock signal REF is inputted to the delay line 120, the DLL circuit 100 may control the delay line 120 to align the phase of the reference clock signal REF with the phase of the feedback clock signal FB. When the injected reference clock signal REF_P is inputted to the delay line 120 in the locked state of the DLL circuit 100, the DLL circuit 100 maintains in the locked state even when the predetermined pattern is presented in the injected reference clock signal REF_P. In other words, the predetermined pattern included in the injected reference clock signal REF_P may propagate through the delay line 120 during the locked state of the DLL circuit 100. In this way, the delay around the DLL circuit 100 may be measured during the locked state of the DLL circuit 100 based on the injection and detection of the predetermined pattern. The measurement of the delay around the DLL circuit 100 in the locked state is described as an example only, and the disclosure is not limited thereto. The delay around the DLL circuit 100 could be measured any time after the phase of the reference clock signal REF is aligned with the phase of the feedback clock signal FB. This alignment could occur during a lock process. After the lock process, the DLL circuit 100 could be put into a freeze mode where all updates to the delay line 120 of the DLL circuit 100 are suspended. The delay around the DLL circuit 100 could be measured in this freeze mode. In addition, the DLL circuit 100 may have a manual override mode that force the clock alignment of the reference clock signal REF and the feedback clock signal FB, and the delay around the DLL circuit 100 could also be measured in this manual override mode. In other words, the delay measurement can be run when the DLL is traditionally locked, or any time when the clock alignment of the reference clock signal REF and the feedback clock signal FB is provided.

In some embodiments, the DLL circuit 100 may further includes other delay lines in addition to the delay line 120. The delay line 120 can be a dedicated delay line that is calibrated to provide alignment of clock signals REF and FB, and this delay line can be used for delay measurement of the DLL circuit 100. The control settings of this calibrated dedicated delay line can be shared with other delay lines, and these other delay lines can be used to send clocks and commands to the system. In other words, the dedicated delay line (i.e., delay line 120) can be used for aligning clock signals and for measuring the delay around the DLL circuit 100, and the other delay lines (i.e., replica delay lines) can be used for sending clocks and commands to the system. In some alternative embodiments, there is no dedicated delay line used only for aligning clock signals and for delay measurement of the DLL circuit, and the delay line 120 is used for aligning clocks, measuring the delay around the DLL circuit 100, and for sending a clock to the system.

In some embodiments, the pattern detecting circuit 130 receives the reference clock signal REF and the feedback clock signal FB, and is configured to detect the predetermined pattern included in the feedback clock signal FB. The pattern detecting circuit 130 may detect the predetermined pattern by detecting pulse edges of the feedback clock signal FB and the reference clock signal REF. For example, the pattern detecting circuit 130 may detect misalignment of the pulse edges of the feedback clock signal FB and the pulse edges of the reference clock signal REF, so as to detect the predetermined pattern included in the feedback clock signal FB. When predetermined pattern in the feedback clock signal FB is detected, the pattern detecting circuit 130 outputs a detection signal DS to the counter 140.

The counter 140 may receive detection signal DS, the reference clock signal REF and the reset signal RST, and is configured to count a number of clock cycles from a timing when the predetermined pattern is asserted to the reference clock signal REF to a timing when the predetermined pattern is detected by the pattern detecting circuit 130. In some embodiments, the counter 140 is enabled by the assertion of the reset signal RST and starts counting at the timing when the reset signal RST is asserted to the counter 140. The counter 140 may stop counting at the timing when the detection signal DS from the pattern detecting circuit 130 is asserted to the counter 140. The counter 140 may output a count value CNT which indicates a delay of the DLL circuit 100. The count value CNT may indicate a number of clock cycles of the reference clock signal REF during a time period from the timing when the reset signal RST is asserted to the counter 140 to the timing when the detection signal DS is asserted to the counter 140.

In some embodiments, the DLL circuit 100 further includes a signal generator 160 that includes a signal generating circuit 161 for generating the reset signal RST. The signal generating circuit 161 may receive a trigger signal START and the reference clock signal REF, and is configured to generate the reset signal RST upon an assertion trigger signal START. The generated reset signals RST is outputted to the pattern injecting circuit 110 and the counter 140. The disclosure does not intend to limit any particular circuit structure of the signal generating circuit 161, thus any circuit that has a function of outputting the reset signal RST upon the assertion of the trigger signal START falls within the scope of the signal generator 160.

In some embodiments, when the reset signal RST is not asserted to the pattern injecting circuit 110, the pattern injecting circuit 110 provides the reference clock signal REF to the delay line 120. The delay line 120 is controlled to align the phase of the reference clock signal REF with the phase of the feedback clock signal FB. After the phases of the reference clock signal REF and the feedback clock signal FB are aligned to each other (i.e., when the DLL circuit 100 is in the locked state), the reset signal RST may be asserted to the pattern injecting circuit 110 so as to measure the delay of the DLL circuit 100. In this way, the delay measurement which is triggered by the reset signal RST can be performed at any time. Once the reset signal RST is asserted to the pattern injecting circuit 110, the pattern injecting circuit 110 injects the predetermined pattern to the reference clock signal REF to generate the injected reference clock signal REF_P which is then outputted to the delay line 120. In this way, the predetermined pattern may propagate through the delay line 120 during the locked state of the DLL circuit. Meanwhile, upon the assertion of the reset signal RST, the counter 140 is enabled and start counting. The output signal OUT of the delay line 120 is fed back by the feedback path 150 as the feedback clock signal FB which is then asserted to the pattern detecting circuit 130. When the predetermined pattern is detected by the pattern detecting circuit 130, the pattern detecting circuit 130 stops the counting and outputs the count value CNT which indicates the delay around the DLL circuit 100. In addition, as the delay measurement is performed during the period where the DLL circuit 100 is locked and fully functional, the delay measurement reflects real delay in normally operated system environment, thus the delay measurement is accurate and reliable.

Figure 2A:
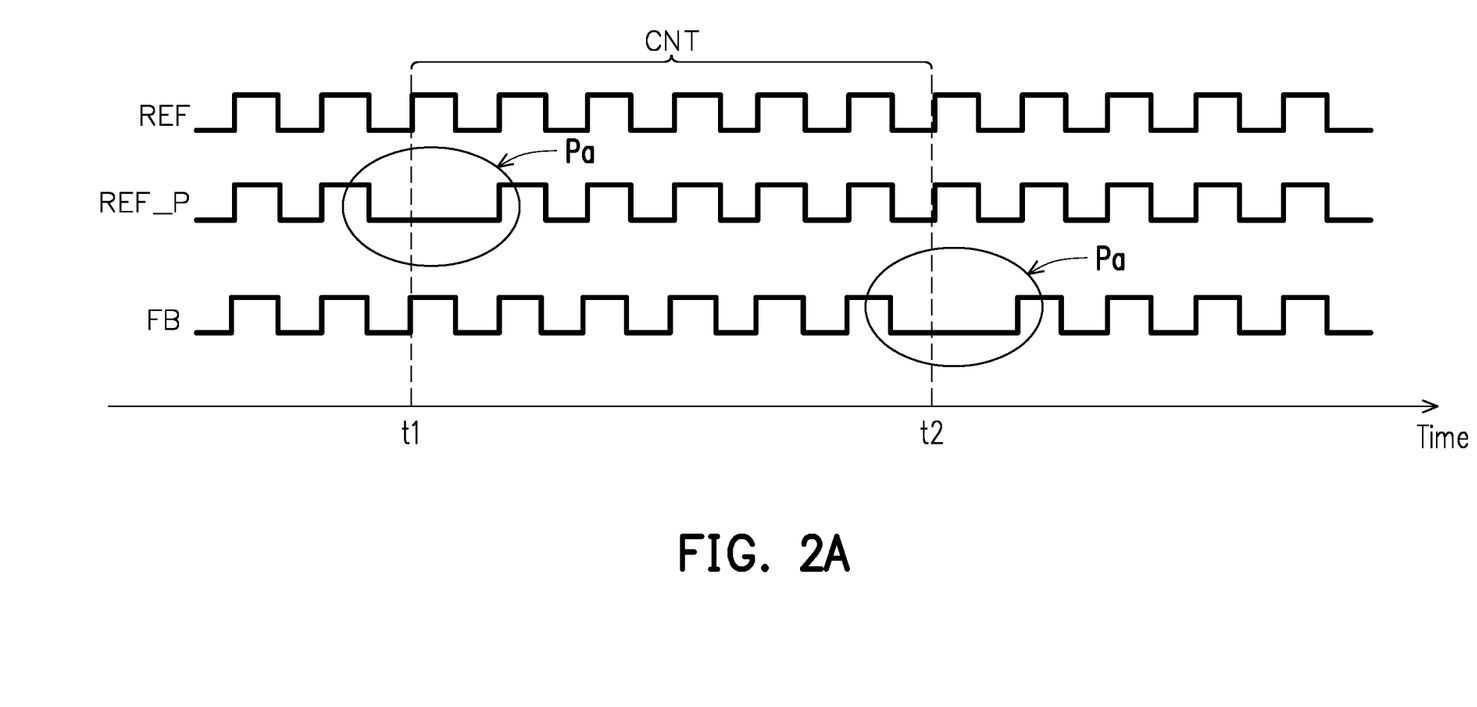
FIG. 2A and FIG. 2B illustrate timing diagrams of signals in the DLL circuit in accordance with some embodiments.

FIG. 2A illustrates a timing diagram of the reference clock signal REF, the injected reference clock signal REF_P and the feedback clock signal FB in the DLL circuit 100 in accordance with some embodiments. Referring to FIG. 1 and FIG. 2A, at the timing t1, the pattern injecting circuit 110 injects a predetermine pattern (i.e., an absence of one clock pulse Pa) to the reference clock signal REF to generate the injected reference clock signal REF_P, and provides the injected reference clock signal REF_P to the delay line 120. Meanwhile, the counter 140 starts counting. The predetermined pattern propagates through the delay line 120 and is fed back in the feedback clock signal FB. Once the pattern detecting circuit 130 detects the predetermined pattern (i.e., the absence of the clock pulse Pa) in the feedback clock signal FB at timing t2, the counter 140 stops counting. The number of clock cycles N from the timing when counter 140 start counting to the timing when the counter 140 stops counting is outputted as the count value CNT which indicates the delay around the DLL circuit 100.

Figure 2B:
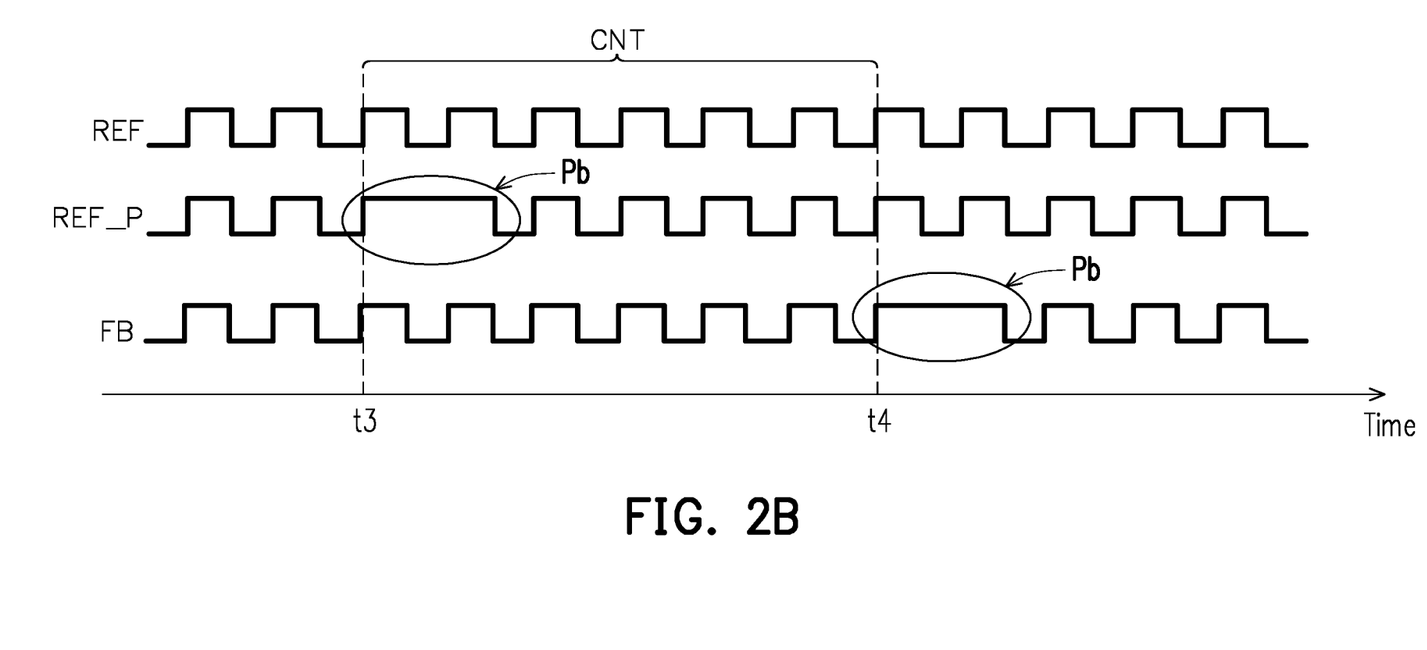

FIG. 2B illustrates a timing diagram of the reference clock signal REF, the injected reference clock signal REF_P and the feedback clock signal FB in the DLL circuit 100 in accordance with some embodiments. Referring to FIG. 1 and FIG. 2B, at the timing t3, the pattern injecting circuit 110 injects a predetermine pattern (i.e., an addition of one clock pulse Pb) to the reference clock signal REF to generate the injected reference clock signal REF_P, and provides the injected reference clock signal REF_P to the delay line 120. Meanwhile, the counter 140 starts counting. The predetermined pattern propagates through the delay line 120 and is fed back in the feedback clock signal FB. Once the pattern detecting circuit 130 detects the predetermined pattern (i.e., the addition of the clock pulse Pb) in the feedback clock signal FB at timing t4, the counter 140 stops counting. The number of clock cycles N from the timing when counter 140 start counting to the timing when the counter 140 stops counting is outputted as the count value CNT which indicates the delay around the DLL circuit 100.

Figure 3A:
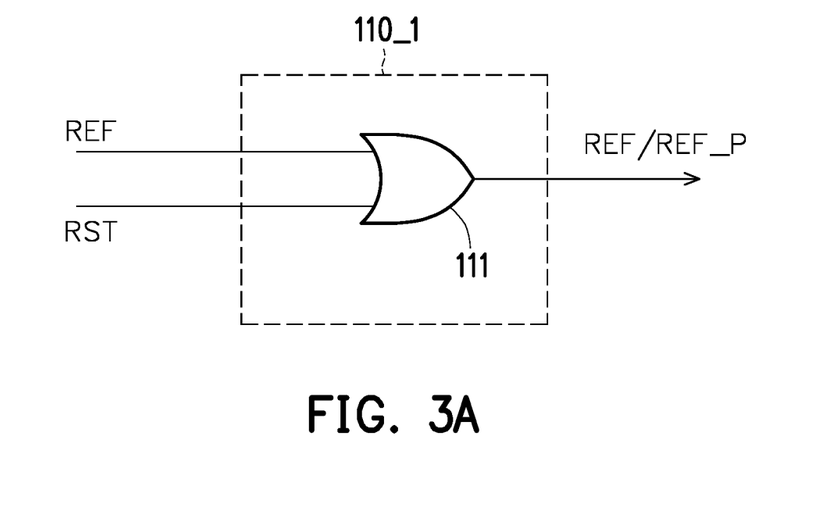
FIG. 3A and FIG. 3B illustrate schematic diagrams of a pattern injecting circuit of a DLL circuit in accordance with some embodiments.
Figure 3B:
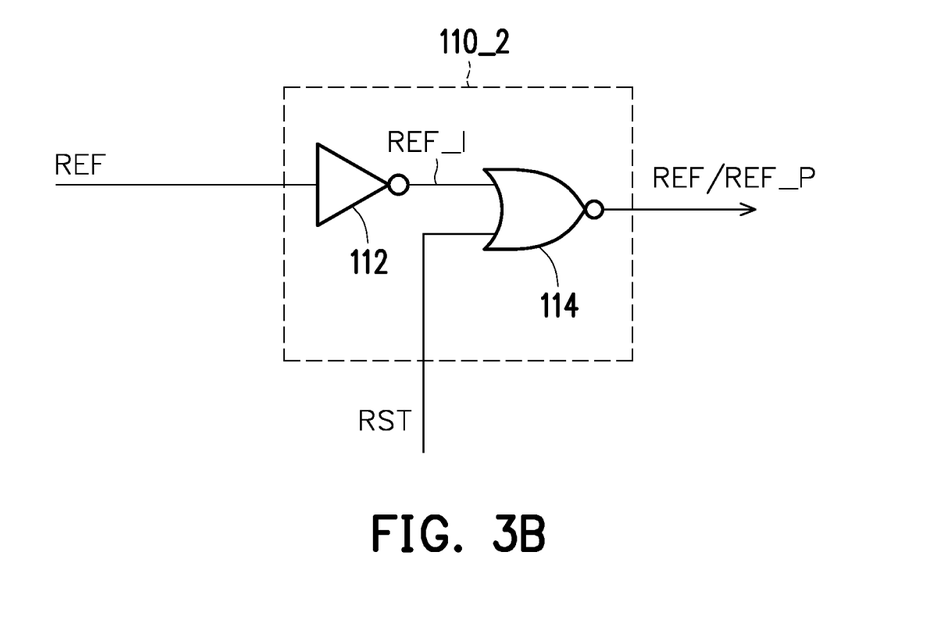

FIG. 3A through FIG. 3B illustrate schematic diagrams of pattern injecting circuits 110_1 and 110_2 of a DLL circuit in accordance with some embodiments. The pattern injecting circuit 110 of the DLL circuit 100 in FIG. 1 may be any one but not limited to the pattern injecting circuits 110_1 and 110_2 shown in FIG. 3A and FIG. 3B. Referring to FIG. 3A, the pattern injecting circuit 110_1 may include a logic circuit 111 that has input terminals receiving the reference clock signal REF and the reset signal RST. The logic circuit 111 is configured to perform a logic operation to the received signals (i.e., reference clock signal REF and the reset signal RST) to generate the reference clock signal REF or the injected reference clock signal REF_P. In some embodiments, the logic circuit 111 is configured to generate the injected reference clock signal REF_P when the reset signal RST is in the first logic state; and the logic circuit 111 is configured to generate the reference clock signal REF when the reset signal RST is in the second logic state. In some embodiments, the logic circuit 111 is an OR logic gate that is configured to perform an OR operation to the reference clock signal REF and the reset signal RST. When the reset signal RST is in the first logic state (i.e., logic state "1"), the logic circuit 111 may insert a predetermined pattern (i.e., high pulse) to the reference clock signal REF to generate the injected reference clock signal REF_P. When the reset signal RST is in the second logic state (i.e., logic state "0"), the logic circuit 111 may output the reference clock signal REF to the output terminal of the logic circuit 111. In this way, the pattern injecting circuit 110_1 may inject the predetermined pattern (i.e., high pulse) to the reference clock signal REF based on the reset signal RST.

Referring to FIG. 3B, the pattern injecting circuit 110_2 may include logic circuits 112 and 114. In the example shown in FIG. 3B, the logic circuit 112 is an inverter that is configured to invert the reference clock signal REF to generate an inverted reference clock signal REF_1; and the logic circuit 114 is a NOR gate that performs a NOR operation to the inverted reference clock signal REF_1 and the reset signal RST to generate the injected reference clock signal REF_P. In some embodiments, when the reset signal RST is in the first logic state (i.e., logic state "1"), the pattern injecting circuit 110_2 injects a predetermined pattern (i.e., low pulse) to the reference clock signal REF to generate the injected reference clock signal REF_P. When the reset signal RST is in the second logic state (i.e., logic state "0"), the pattern injecting circuit 110_2 output the reference clock signal REF. In this way, the pattern injecting circuits 110_2 may inject the predetermined pattern to the reference clock signal REF based on the reset signal RST. It is appreciated that the pattern injecting circuit of the DLL circuit is not limited to what are shown in FIG. 3A and FIG. 3B, and the circuit structure of the pattern injecting circuit may vary according to the designed needs.

Figure 4A:
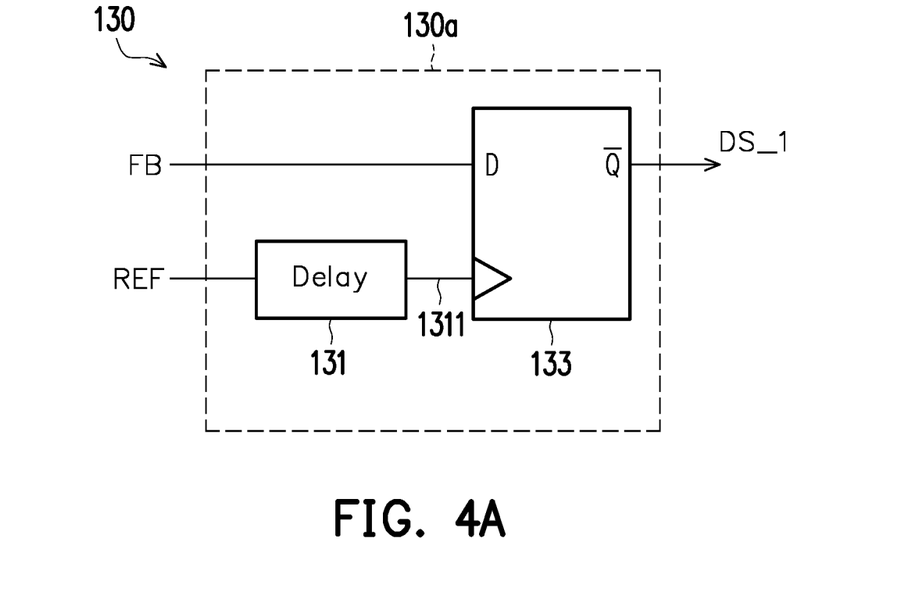
FIG. 4A through FIG. 4E illustrates schematic diagrams of a pattern detecting circuit and timing diagrams of signals in the pattern detecting circuit in accordance with some embodiments.
Figure 4B:
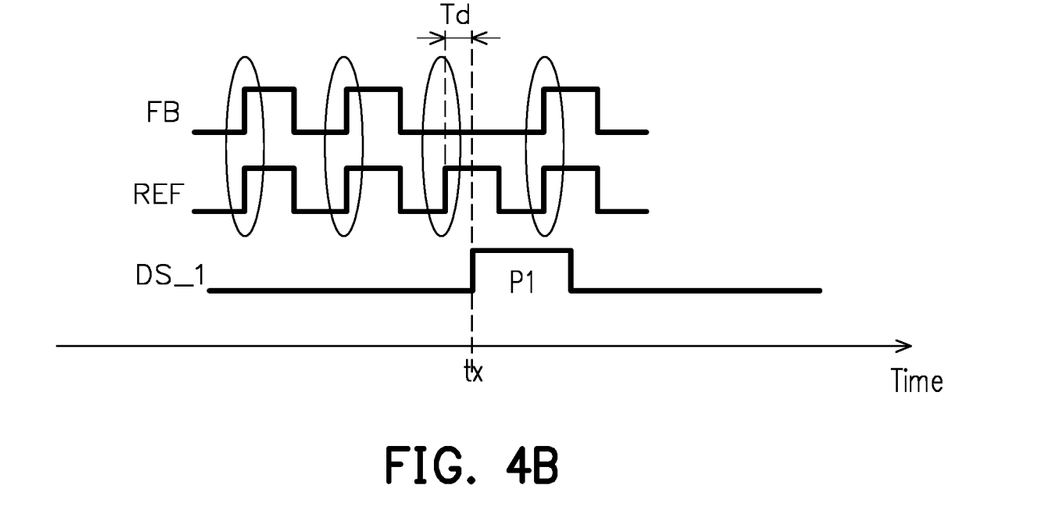

FIG. 4A through FIG. 4E illustrate schematic diagrams of the pattern detecting circuits 130 and timing diagrams of signals in the pattern detecting circuits in accordance with some embodiments. Referring to FIG. 4A, the pattern detecting circuit 130 may include an edge detection circuit 130a that is formed by the delay circuit 131 and a latch circuit 133. The edge detection circuit 130a may detect edges of the reference clock signal REF and the feedback clock signal FB, and thus, being capable of detecting an absence of at least one clock pulse in the feedback clock signal FB. When the predetermined pattern includes the absence of at least one clock pulse, the edge detection circuit 130a may detect the predetermined pattern. The delay circuit 131 of the edge detection circuit 130a receives the reference clock signal REF and is configured to delay the reference clock signal REF for a predetermined delay period to generate a delayed reference clock signal 1311. The latch circuit 133 of the edge detection circuit 130a receives the delayed reference clock signal 1311 and the feedback clock signal FB and is configured to perform a latching operation based on the logic states of the delayed reference clock signal 1311 and the feedback clock signal FB to detect predetermined pattern. The edge detection circuit 130a may output a signal DS_1 for indicating a detection of the absent clock pulse (i.e., predetermined pattern) in the feedback clock signal FB. As the example show in FIG. 4B, when the feedback clock signal FB includes an absence of a clock pulse (i.e., a predetermined pattern), the edge detection circuit 130a may output the signal DS_1 with a pulse P1 at timing tx to indicate the detection of the predetermined pattern in the feedback clock signal FB. In an example, the latch circuit 133 is an edge triggered flip-flop that is configured to capture and release data on rising edges of the delayed reference clock signal 1311. As shown in FIG. 4A and FIG. 4B, the delay circuit 131 causes a delay period Td from the rising edge of the reference clock signal REF to the timing tx where the pulse P1 occurs.

Figure 4C:
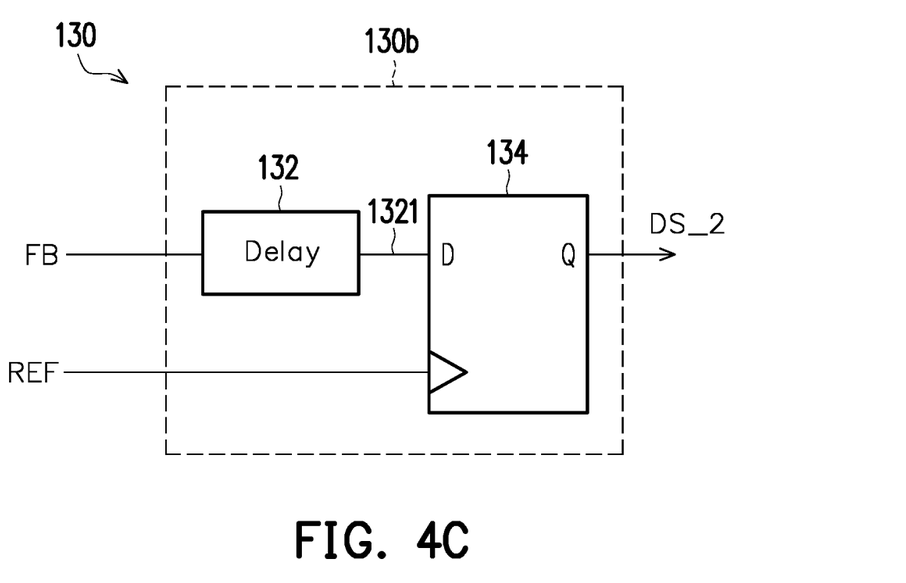
Figure 4D:
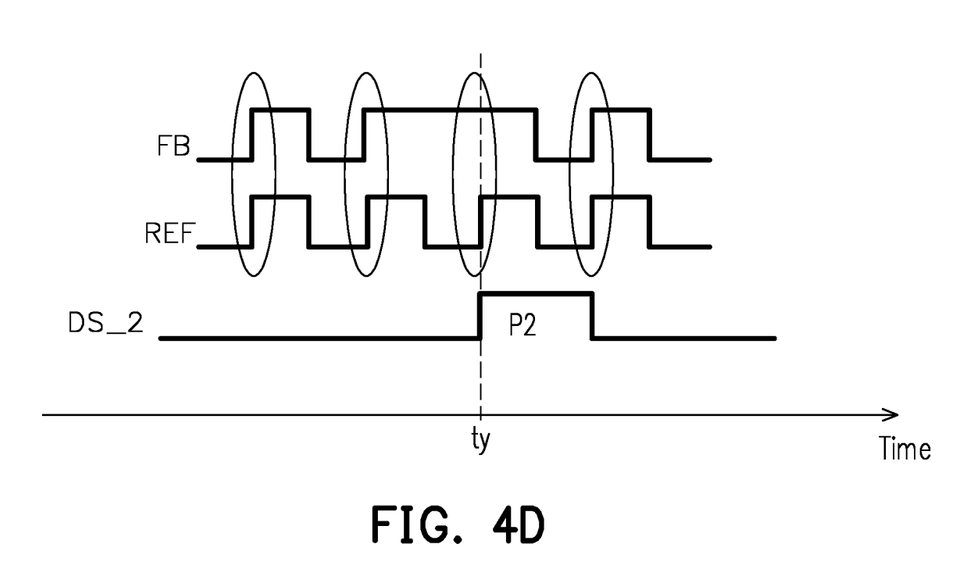

FIG. 4C illustrates a schematic diagram of the pattern detecting circuit 130 in accordance with some embodiments. Referring to FIG. 4C, the pattern detecting circuit 130 may include an edge detection circuit 130b that is formed by the delay circuit 132 and a latch circuit 134. The edge detection circuit 130b may detect edges of the reference clock signal REF and the feedback clock signal FB, and thus, being capable of detecting an addition of at least one clock pulse in the feedback clock signal FB. When the predetermined pattern includes the addition of at least one clock pulse, the edge detection circuit 130b may detect the predetermined pattern. The delay circuit 132 receives the feedback clock signal FB and is configured to delay feedback clock signal FB for a predetermined delay period to generate a delayed feedback clock signal 1321. The latch circuit 134 receives the delayed feedback clock signal 1321 and the reference clock signal REF, and is configured to perform a latching operation based on the logic states of the delayed feedback clock signal 1321 and the reference clock signal REF to detect the addition of at least one clock pulse (i.e., predetermined pattern). The edge detection circuit 130b may output the signal DS_2 for indicating a detection of the added one clock pulse (i.e., predetermined pattern) in the feedback clock signal FB. As the example show in FIG. 4D, when the feedback clock signal includes an addition of a clock pulse (i.e., a predetermined pattern), the edge detection circuit 130b may output the signal DS_2 with a pulse P2 at timing ty to indicate the detection of the predetermined pattern in the feedback clock signal FB. In an example, the latch circuit 134 is an edge triggered flip-flop that is configured to capture and release data on rising edges of the reference clock signal REF. As shown in FIG. 4C and FIG. 4D, the pulse P2 aligns with the rising edge of the reference clock signal REF at timing ty.

Figure 4E:
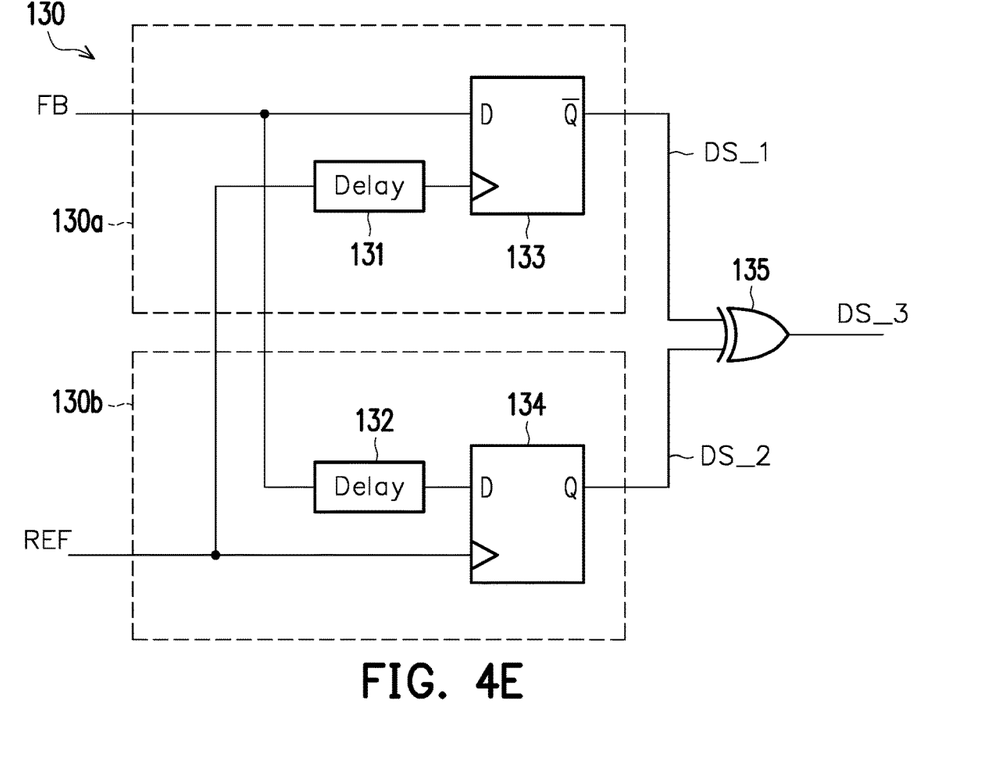

FIG. 4E illustrates the schematic diagram of the pattern detecting circuit 130 in accordance with some embodiments. The pattern detecting circuit 130 includes a logic circuit 135 and edge detection circuits 130a and 130b. The edge detection circuits 130a and 130b are illustrated in FIG. 4A and FIG. 4C and are described above, thus the detailed description about the edge detection circuits 130a and 130b are omitted hereafter. The logic circuit 135 is coupled to output terminals of the edge detection circuits 130a and 130b to receive the signals DS_1 and DS_2, and is configured to perform a logic operation to the received signals to generate the signal DS_3. In some embodiments, the logic circuit 135 is an XOR logic circuit that is configured to perform an XOR operation to the received signals DS_1 and DS_2 to generate the signal DS_3. In this way, the pattern detecting circuit 130 in FIG. 4E may detect the addition of at least one clock pulse, the absence of at least one clock pulse, or a combination thereof. As such, the pattern detecting circuit 130 in FIG. 4E may be applied to a wide range of applications. However, when the predetermined pattern includes only the absence of at least one clock pulse or the addition of at least one clock pulse, the pattern detecting circuit 130 in FIG. 4A and 4C are sufficient to detect the predetermined pattern. Thus, the design of the pattern detecting circuit 130 may vary according to actual design of the predetermined pattern and designed requirements. The disclosure does not intend to limit the structure of the pattern detecting circuit 130, and any circuit structure that is capable of detecting a predetermined pattern should fall within the scope of the pattern detecting circuit 130.

Figure 5:
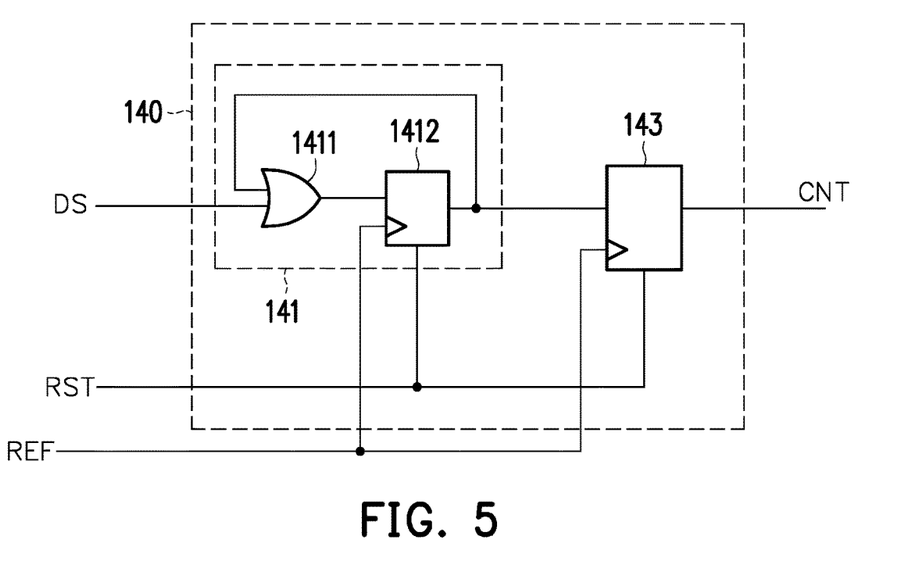
FIG. 5 illustrates a schematic diagram of a counter of a DLL circuit in accordance with some embodiments.

FIG. 5 illustrates a schematic diagram of the counter 140 of the DLL circuit 100 in accordance with some embodiments. The counter 140 may include a stop signal generating circuit 141 and a counter circuit 143. The stop signal generating circuit 141 receives the detection signal DS, the reset signal RST and the reference clock signal REF, and is configured to generate a stop signal STOP according to receipt of the detection signal DS. In some embodiments, the stop signal generating circuit 141 includes an OR logic circuit 1411 and a latch circuit 1412, wherein OR logic circuit 1411 receives the detection signal DS and an output of the latch circuit 1412 as input signals. The OR logic circuit 1411 performs an OR operation to the input signals, and output of the OR logic circuit 1411 is provided to the latch circuit 1412. The latch circuit 1412 is enabled by the reset signal RST, and is configured to perform a latch operation according to the reference clock signal REF and the output of the OR logic circuit 1411 to generate the stop signal STOP.

The counter circuit 143 may receive the stop signal STOP, the reset signal RST and the reference clock signal REF, and is configured to count a number of clock cycles of the reference clock signal REF from a timing when the reset signal is asserted to a timing when the stop signal STOP is asserted. More particularly, at the timing when the reset signal RST is asserted to the counter circuit 143, the counter circuit 143 starts counting by incrementing the count value CNT by one every clock cycle. At the timing when the stop signal STOP is asserted to the counter circuit 143, the counter circuit 143 stops counting, and outputs the count value CNT which indicate the delay around the DLL circuit (i.e., the DLL circuit 100 shown in FIG. 1).

Figure 6:
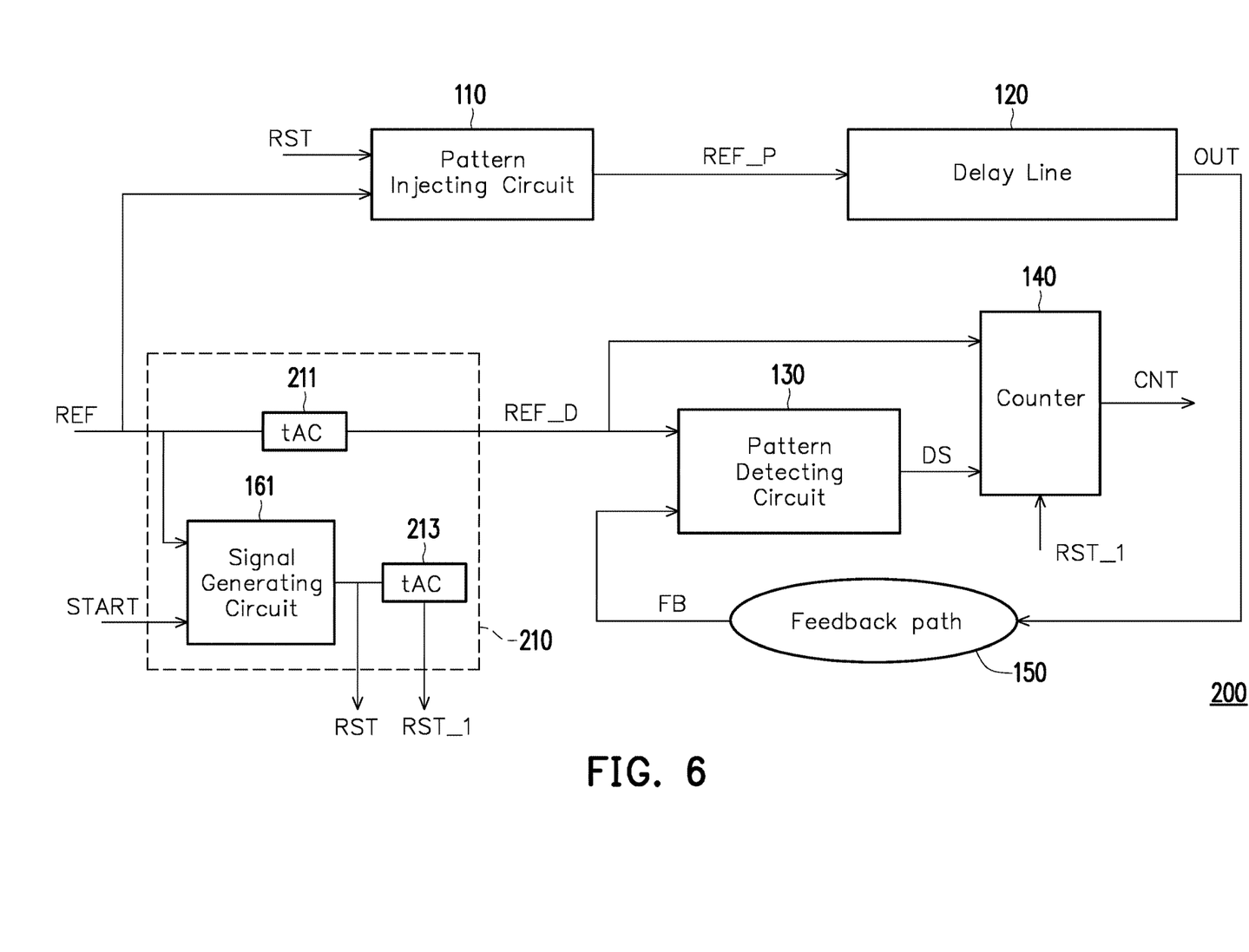
FIG. 6 illustrates a schematic diagram of a DLL circuit in accordance with some alternative embodiments.

FIG. 6 illustrates a schematic diagram of a DLL circuit 200 in accordance with some embodiments. A difference between the DLL circuit 100 shown in FIG. 1 and the DLL circuit 200 shown in FIG. 6 is that the DLL circuit 200 includes the signal generator 210 that includes a signal generating circuit 161, and delay circuits 211 and 213. The delay circuit 211 receives the reference clock signal REF and delays the reference clock signal REF for a delay period to generate the delayed reference clock signal REF_D. The signal generating circuit 161 is configured to generate the reset signal RST upon the assertion of the trigger signal START. The delay circuit 213 is coupled to the signal generating circuit 161 to receive the reset signal RST and is configured to delay the reset signal RST for a delay period to generate a reset signal RST_1. In some embodiments, the delay circuits 211 and 213 have the same circuit structure, and the delay period that is generated by the delay circuit 211 is substantially same as the delay period that is generated by the delay circuit 213.

The delay circuits 211 and 213 in the DLL circuit 200 may allow the DLL circuit 200 to accommodate and support a trimming function. In an example, when trimming the DLL circuit 200, delay circuit 211 may add delay to the reference clock signal REF to generate the delayed reference clock signal REF_D. With this delay, when the DLL circuit 200 is locked, the edges of the delayed reference clock signal REF_D and feedback clock signal FB will be aligned, and the reference clock signal REF and the feedback clock signal FB will be offset by the same delay value. As such, with no trim (i.e., the delay through the delay circuit 211 being '0'), the edges of the reference clock signal REF and feedback clock signal FB are ideally aligned. With trim, the edges of the reference clock signal REF and feedback clock signal FB can be skewed with the trim delay. The delay circuit 211 may support the trimming function, and the delay circuit 213 may be a replica delay that allows proper measurement of the delay around the DLL circuit 200 even when trimming function is implemented. In an example, the trimming function can be used for tuning purposes for the memory device that is coupled to or include the DLL circuit 200.

Another difference between the DLL circuit 100 shown in FIG. 1 and the DLL circuit 200 shown in FIG. 6 is that the pattern detecting circuit 130 and the counter 140 of the DLL circuit 200 operates based on the delayed reset signal RST_1 and the delayed reference clock signal REF_D instead of the reset signal RST and the reference clock signal REF. It is noted that the pattern injecting circuit 110 of the DLL circuit 200 still operates according to the reset signal RST and the reference clock signal REF. As the pattern detecting circuit 130 and the counter 140 operates based on the reset signal RST_1 and the delayed reference clock signal REF_D, there is more time for the pattern injecting circuit 110 of the DLL circuit 200 to inject the predetermined pattern to the reference clock signal REF. In this way, the delay around the DLL circuit 200 can be properly measured through inserting and detecting the predetermined pattern even when trimming function is implemented.

Figure 7:
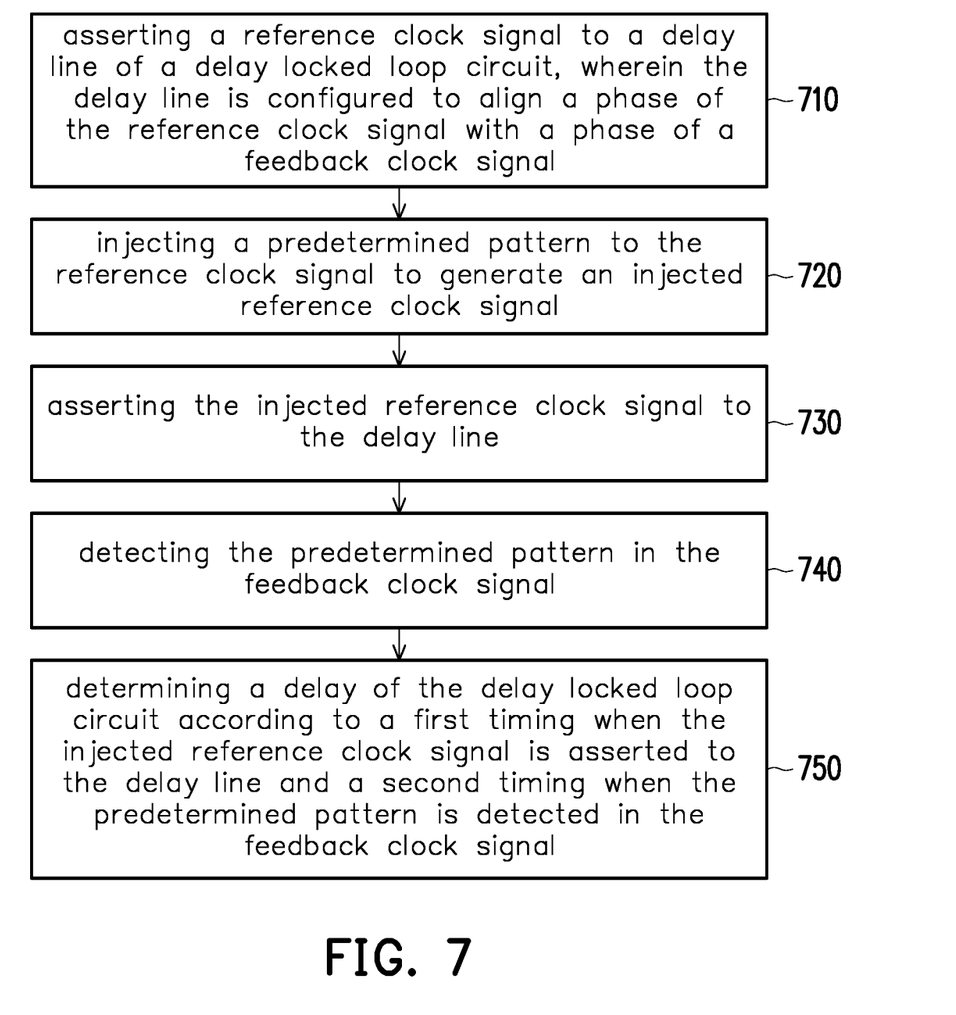
FIG. 7 illustrates a flowchart diagram of a method of measuring a delay of a DLL circuit in accordance with some embodiments.

FIG. 7 illustrates a flowchart diagram of a method for measuring a delay of a DLL circuit in accordance with some embodiments. In block 710, a reference clock signal is asserted to a delay line of a delay locked loop circuit, wherein the delay line is configured to align a phase of the reference clock signal with a phase of a feedback clock signal. In block 720, a predetermined pattern is injected to the reference clock signal to generate an injected reference clock signal. In block 730, the injected reference clock signal is asserted to the delay line. In block 740, the predetermined pattern in the feedback clock signal is detected. In block 750, a delay of the delay locked loop circuit is determined according to a first timing when the injected reference clock signal is asserted to the delay line and a second timing when the predetermined pattern is detected in the feedback clock signal.

In summary, according to embodiments of the disclosure, a pattern injecting circuit of a DLL circuit may inject a predetermined pattern to a reference clock signal, in which the predetermined pattern may propagate through a delay line, be fed back during a locked state of the DLL circuit, and be detected by a pattern detecting circuit. As the DLL delay is measured during the locked state of the DLL circuit, the measured delay reflects the real delay in normally operated system environment, thus the accuracy of the delay measurement is improved. In addition, as the delay measurement is triggered any time with the assertion of the reset signal, the delay measurement could be repeated without disrupting system behavior. The delay measurement can be run while the system is engaged in normal, functional operation, and it can be run without affecting normal operations of the system. In addition, in some embodiments, a signal generator of the DLL circuit may insert delays to the reference clock signal and the reset signal, allowing the DLL circuit accommodating the trimming function. Furthermore, complex predetermined patterns with multiple consecutive or non-consecutive pulses may be used to mitigate impacts of noises and distorted signals on the measurement of the delay.

Although the embodiment of the disclosure has been described in detail, the disclosure is not limited to a specific embodiment and various modifications and changes are possible within the scope of the disclosure disclosed in the claims.

What is claimed is:

1. A method of measuring a delay of a delay locked loop circuit, comprising:
asserting a reference clock signal to a delay line of the delay locked loop circuit, wherein the delay line is configured to align a phase of the reference clock signal with a phase of a feedback clock signal;
injecting a predetermined pattern to the reference clock signal to generate an injected reference clock signal;
asserting the injected reference clock signal to the delay line;
detecting the predetermined pattern in the feedback clock signal; and
determining the delay of the delay locked loop circuit according to a first timing when the injected reference clock signal is asserted to the delay line and a second timing when the predetermined pattern is detected in the feedback clock signal.

2. The method of claim 1, wherein injecting the predetermined pattern to the reference clock signal to generate the injected reference clock signal comprising:
performing a logic operation to inject the predetermined pattern to the reference clock signal to generate the injected reference clock signal upon an assertion of a reset signal.

3. The method of claim 2, wherein
the predetermined pattern includes a pulse that is held at a first logic state for at least one clock cycle of the reference clock signal.

4. The method of claim 2, wherein
the predetermined pattern includes a pulse that is held at a second logic state for at least one clock cycle of the reference clock signal.

5. The method of claim 2, wherein
the injected reference clock signal is asserted to the delay line after the phase of the reference clock signal is aligned with the phase of the feedback clock signal.

6. The method of claim 1, wherein detecting the predetermined pattern in the feedback clock signal comprises:
detecting pulse edges of the reference clock signal and the pulse edges of the feedback clock signal;
determining a misalignment of the pulse edges of the reference clock signal and the pulse edges of the feedback clock signal; and
outputting a detection signal in response to detecting the misalignment of the pulse edges of the reference clock signal and the pulse edges of the feedback clock signal.

7. The method of claim 1, wherein determining the delay of the delay locked loop circuit based on a time period from the first timing when the injected reference clock signal is supplied to the delay line and the second timing when the predetermined pattern is detected in the feedback clock signal comprises:
counting a number of clock cycles of the reference clock signal from the first timing to the second timing to obtain a count value; and
outputting the count value as the delay of the delay locked loop circuit.

8. The method of claim 7, wherein counting the number of clock cycles of the reference clock signal from the first timing to the second timing comprising:
starting counting, by a counter of the delay locked loop circuit, at the first timing when the injected reference clock signal is asserted to the delay line; and
stopping counting, by the counter of the delay locked loop circuit, at the second timing when the predetermined pattern is detected in the feedback clock signal.

9. The method of claim 2, further comprising:
delaying the reference clock signal to generate a delayed reference clock signal;
delaying the reset signal to generate a delayed reset signal, wherein
the predetermined pattern in the feedback clock signal is detected according to the delayed reference clock signal and the feedback clock signal, and
the delay of the delay locked loop circuit is determined according to the delayed reference clock signal and the delayed reset signal.

10. A delay locked loop circuit, comprising:
a delay line, receiving a reference clock signal and generating a feedback clock signal, wherein the delay line is configured to align a phase of the reference clock signal with a phase of the feedback clock signal;
a pattern injecting circuit, coupled to the delay line, injecting a predetermined pattern to the reference clock signal to generate an injected reference clock signal, and asserting the injected reference clock signal to the delay line;
a pattern detecting circuit, coupled to the delay line, detecting the predetermined pattern in the feedback clock signal;
a counter, coupled to the pattern detecting circuit, determining a delay of the delay locked loop circuit according to a first timing when the injected reference clock signal is asserted to the delay line and a second timing when the predetermined pattern is detected in the feedback clock signal.

11. The delay locked loop circuit of claim 10, wherein
the pattern injecting circuit comprises a logic circuit, and
the logic circuit is configured to perform a logic operation to inject the predetermined pattern to the reference clock signal to generate the injected reference clock signal upon an assertion of a reset signal to the logic circuit.

12. The delay locked loop circuit of claim 11, wherein
the pattern detecting circuit detects the predetermined pattern in the feedback clock signal according to the reference clock signal, and
the counter determines the delay of the delay locked loop circuit according to the reference clock signal and the reset signal.

13. The delay locked loop circuit of claim 11, wherein
the predetermined pattern is a pulse that is held at a first logic state for at least one clock cycle of the reference clock signal.

14. The delay locked loop circuit of claim 11, wherein
the predetermined pattern is a pulse that is held at a second logic state for at least one clock cycle of the reference clock signal.

15. The delay locked loop circuit of claim 11, wherein
the pattern injecting circuit is configured to assert the injected reference clock signal to the delay line after the phase of the reference clock signal is aligned with the phase of the feedback clock signal.

16. The delay locked loop circuit of claim 10, wherein the pattern detecting circuit comprises an edge detection circuit that is configured to:
detect pulse edges of the reference clock signal and the pulse edges of the feedback clock signal;
determine a misalignment of the pulse edges of the reference clock signal and the pulse edges of the feedback clock signal; and
output a detection signal in response to detecting the misalignment of the pulse edges of the reference clock signal and the pulse edges of the feedback clock signal.

17. The delay locked loop circuit of claim 16, wherein the counter comprises:
a stop signal generating circuit, coupled to the pattern detecting circuit, generating a stop signal according to the detection signal; and
a counter circuit, coupled to the stop signal generating circuit, counting a number of clock cycles of the reference clock signal from the first timing to the second timing to obtain a count value, and outputting the count value as the delay of the delay locked loop circuit.

18. The delay locked loop circuit of claim 17, wherein
the counter circuit starts counting at the first timing when the injected reference clock signal is asserted to the delay line, and
the counter circuit stops counting at the second timing when the predetermined pattern is detected in the feedback clock signal.

19. The delay locked loop circuit of claim 11, further comprising:
a signal generator, generating the reset signal, wherein the signal generator includes:

a first delay circuit, delaying the reference clock signal to generate a delayed reference clock signal; and a second delay circuit, delaying the reset signal to generate a delayed reset signal.

20. The delay locked loop circuit of claim 19, wherein the pattern detecting circuit detects the predetermined pattern in the feedback clock signal according to the delayed reference clock signal, and the counter determines the delay of the delay locked loop circuit according to the delayed reference clock signal and the delayed reset clock signal.

* * * * *